(12) United States Patent
Burhance et al.

(10) Patent No.: US 7,375,979 B2
(45) Date of Patent: May 20, 2008

(54) METHOD AND APPARATUS FOR ROUTING A DIFFERENTIAL PAIR ON A PRINTED CIRCUIT BOARD

(75) Inventors: Gary R. Burhance, Boynton Beach, FL (US); John C. Barron, Davie, FL (US); Peter J. Bartels, Sunrise, FL (US)

(73) Assignee: Motorola, Inc., Schaumburg, IL (US)

( * ) Notice: Subject to any disclaimer, the term of this patent is extended or adjusted under 35 U.S.C. 154(b) by 310 days.

(21) Appl. No.: 11/089,986

(22) Filed: Mar. 25, 2005

(65) Prior Publication Data

US 2006/0215375 A1  Sep. 28, 2006

(51) Int. Cl.
*H05K 1/11* (2006.01)

(52) U.S. Cl. .............. 361/801; 361/759; 361/802; 361/756

(58) Field of Classification Search .......... 439/55, 439/679; 174/250–268; 361/792, 795, 801, 361/752–756, 803
See application file for complete search history.

(56) References Cited

U.S. PATENT DOCUMENTS

| | | | | |
|---|---|---|---|---|
| 3,757,028 A | * | 9/1973 | Schlessel | 174/33 |
| 3,761,842 A | * | 9/1973 | Gandrud | 333/1 |
| 5,027,088 A | * | 6/1991 | Shimizu et al. | 333/1 |
| 5,039,824 A | * | 8/1991 | Takashima et al. | 174/33 |
| 5,430,247 A | * | 7/1995 | Bockelman | 174/33 |
| 5,618,185 A | * | 4/1997 | Aekins | 439/76.1 |
| 6,023,200 A | * | 2/2000 | Rhee | 333/1 |
| 6,816,025 B2 | * | 11/2004 | Nguyen | 333/1 |

* cited by examiner

*Primary Examiner*—Tuan T. Dinh
*Assistant Examiner*—Abiy Getachew
(74) *Attorney, Agent, or Firm*—Barbara R. Doutre

(57) ABSTRACT

A differential pair (200) is provided by routing a printed circuit board (202) having high density interconnect (HDI) substrate (204) with first and second metal layers (212, 218) such that a first runner (206) forms a zigzag pattern using the two metal layers while a second runner (208) forms a second zigzag pattern on the same two metal layers. The first and second zigzag patterns overlap so as to provide orthogonal signal flow.

3 Claims, 3 Drawing Sheets

METHOD AND APPARATUS FOR ROUTING A DIFFERENTIAL PAIR ON A PRINTED CIRCUIT BOARD

FIELD OF THE INVENTION

The present invention relates generally to differential pairs and more specifically to the routing of differential pairs on printed circuit boards.

BACKGROUND OF THE INVENTION

Many electronic circuits, such as amplifier circuits, utilize differential pairs to transfer signals. A cable containing a twisted pair of wires is one known means for transferring a differential signal. While the cable containing a twisted pair of wires offers good noise immunity, it is impractical in the world of microelectronics. Runners routed side by side on a printed circuit board have typically been used in the routing of differential signals in microelectronics circuits. FIG. 1 shows the routing of a differential pair 100 formed of runners 102, 104 routed side by side on printed circuit board 106 and coupled to electronic component 108. However the parallel lines 102, 104 tend to pick up signals from adjacent circuitry thus leading to noise on the line. If the two lines absorb noise from different sources, the signal can become unbalanced and the difference in the noise levels can pass through to the amplifier stage.

Accordingly, there is a need for an improved differential pair for use in electronic circuits.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Briefly, in accordance with the present invention, there is provided herein a differential pair that closely simulates a pair of twisted wires in a cable. In accordance with the present invention, a printed circuit board is provided comprising at least one high density interconnect (HDI) substrate with two adjacent metal layers routed with a first runner forming a first zigzag pattern using the two adjacent metal layers, a second runner forming a second zigzag pattern using the same metal layers, wherein the first and second zigzag patterns overlap to provide orthogonal signal flow between the two runners.

High density interconnects (HDI) are generally defined as dielectric substrates which can be laser drilled and then plated to electrically connect a top metal layer to the next metal layer. HDI technology allows for finer lines and spaces (<75 µm) to be used due to smaller vias (<150 µm) and capture pads (<400 µm), and higher connection pad density (>20 pads/cm2) than employed in conventional PCB technology. HDI is used to reduce size and weight, as well as to enhance electrical performance. The differential pair formed in accordance with the present invention utilizes HDI to improve the common mode rejection ratio (CMRR) of the pair.

Figure 1:
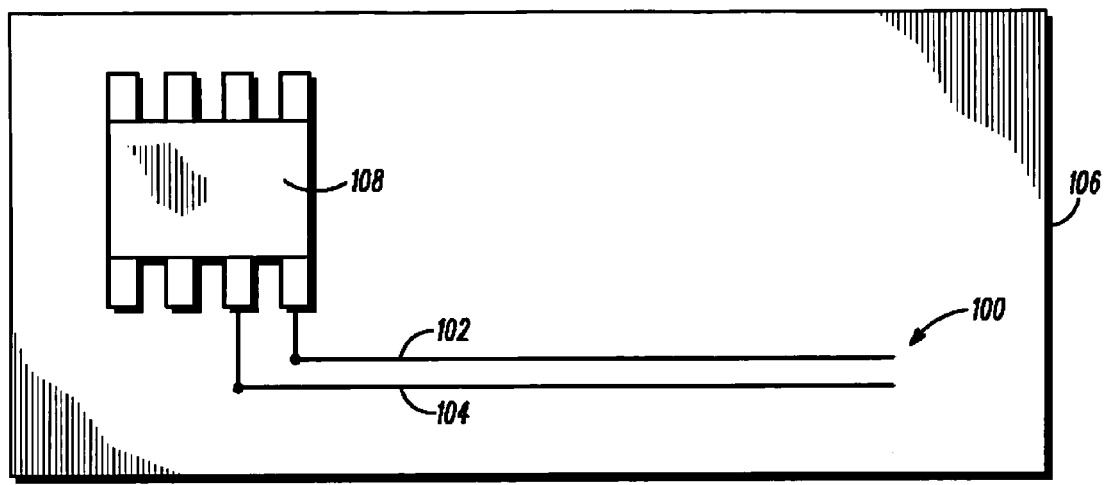
FIG. 1 illustrates a printed circuit board having a prior art differential pair routed thereon.
Figure 2:
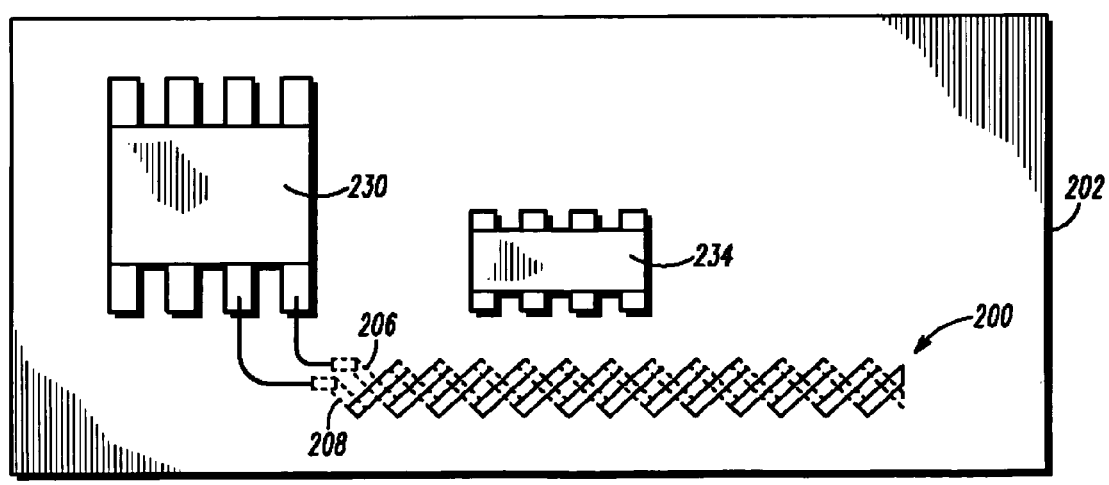
FIG. 2 illustrates a top view of a differential pair on a printed circuit board routed in accordance with the present invention.
Figure 3:
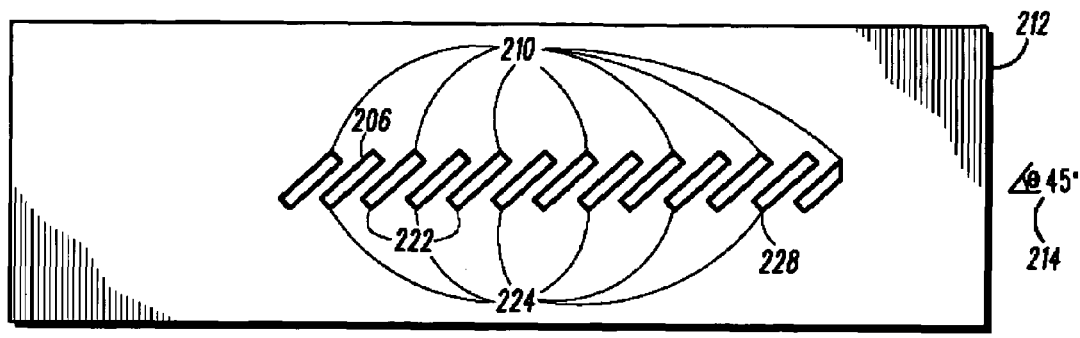
FIG. 3 illustrates a top metal view of the differential pair formed in accordance with the present invention.
Figure 4:
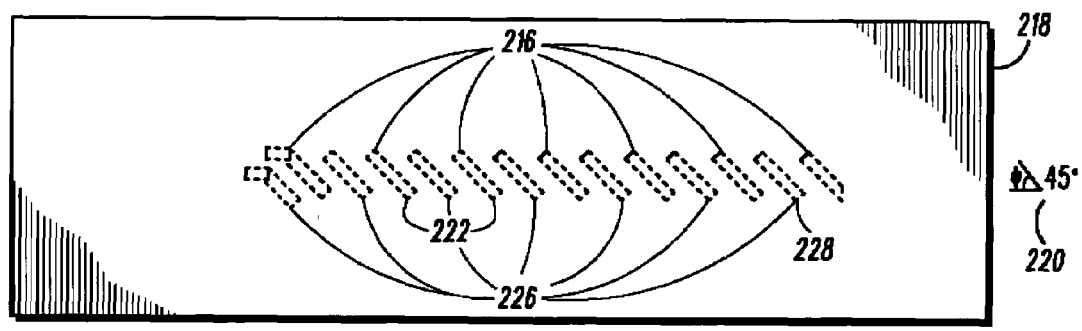
FIG. 4 illustrates an inner metal layer of the differential pair formed in accordance with the present invention.
Figure 5:
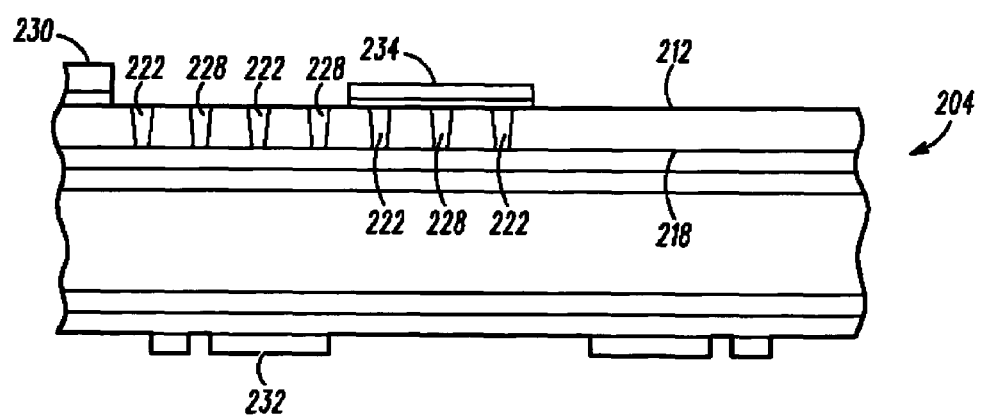
FIG. 5 illustrates a cross sectional view of the differential pair formed in accordance with the present invention.

FIGS. 2-5 illustrates a differential pair 200 routed in accordance with the present invention. FIG. 2 shows a top view with an inner layer shown in phantom. FIG. 3 shows the top metal layer, FIG. 4 shows the inner metal layer and FIG. 5 shows a cross sectional view.

The printed circuit board 202 comprises a high density interconnect (HDI) substrate 204 having first and second metal layers 212, 218 with first and second runners 206, 208 etched thereon to form a differential pair 200 in accordance with the present invention. The differential pair 200 formed in accordance with the present invention transfers a differential signal to or from an electronic component 230. In accordance with the present invention, the first runner 206 is formed of a first set of upper runner portions 210 etched on the first metal layer 212 at a first predetermined angle, $\theta$, 214 and a second set of lower runner portions 216 etched on the second metal layer 218 at an angle, $\phi$, 220 orthogonal to the first predetermined angle 214. Microvias 222 couple the first set of upper runner portions 210 to the second set of lower runner portions 216. The second runner 208 is formed of a third set of upper runner portions 224 etched on the first metal layer 212 at the first predetermined angle 214 in between the first set of upper runner portions 210. A fourth set of lower runner portions 226 etched on the second metal layer 218 at the angle 220 orthogonal to the first predetermined angle in between the second set of lower runner portions 216. Microvias 228 couple the third set of upper runner portions 224 to the fourth set of lower runner portions 226.

Routing the differential pair 200 in an orthogonal fashion in accordance with the present invention tends to balance the noise level in the pair. Thus, other components 232, 234 can be routed beneath and adjacent to the differential pair with minimal impact on noise. Additionally, trace width and spacing of the zigzag pattern can be selected such that the dielectric constant of the HDI board provides a predetermined capacitance per square area that positively impacts circuit performance.

The following Table illustrates an example of data collected for a differential pair formed in accordance with the present invention and onto which audio signals were injected from various circuits.

Isolation Data
Test Conditions: +25 C., Desired Signal = 1.0 kHz at 1.0 Vpp

| Interfering Frequency (Hz) | Crosstalk Level (dBV) for Differential Pair (formed in accordance with the invention) | Crosstalk Level (dBV) Traditional Parallel Lines | Improvement in CMRR (dB) |
|---|---|---|---|
| 2000 | −74.5 | −6.9 | 67.6 |
| 5000 | −68 | 0 | 68 |
| 10000 | −62.53 | 3.5 | 66.03 |
| 15000 | −62 | 4.6 | 66.6 |

-continued

Isolation Data
Test Conditions: +25 C., Desired Signal = 1.0 kHz at 1.0 Vpp

| Interfering Frequency (Hz) | Crosstalk Level (dBV) for Differential Pair (formed in accordance with the invention) | Crosstalk Level (dBV) Traditional Parallel Lines | Improvement in CMRR (dB) |
|---|---|---|---|
| 25000 | −56.24 | 5.38 | 61.62 |
| 50000 | −55.2 | 5.35 | 60.55 |
| 75000 | −58 | 3.27 | 61.27 |
| 100000 | −55 | 3.25 | 58.25 |

Trace Length = approximately 12 cm
Interfering line load impedance = 43 Ohm
Interfering line load voltage = 5 V
Interfering line load current = 117 mA
All measurements are differential As seen from the data, there was a significant improvement in the common mode rejection ration (CMRR). The combination of routing a differential pair in an orthogonal manner in conjunction with HDI technology provides the opportunity to closely emulate the benefits of a twisted pair of wires. The differential pair routed in accordance with the present invention in an orthogonal manner currently in use.

Figure 6:
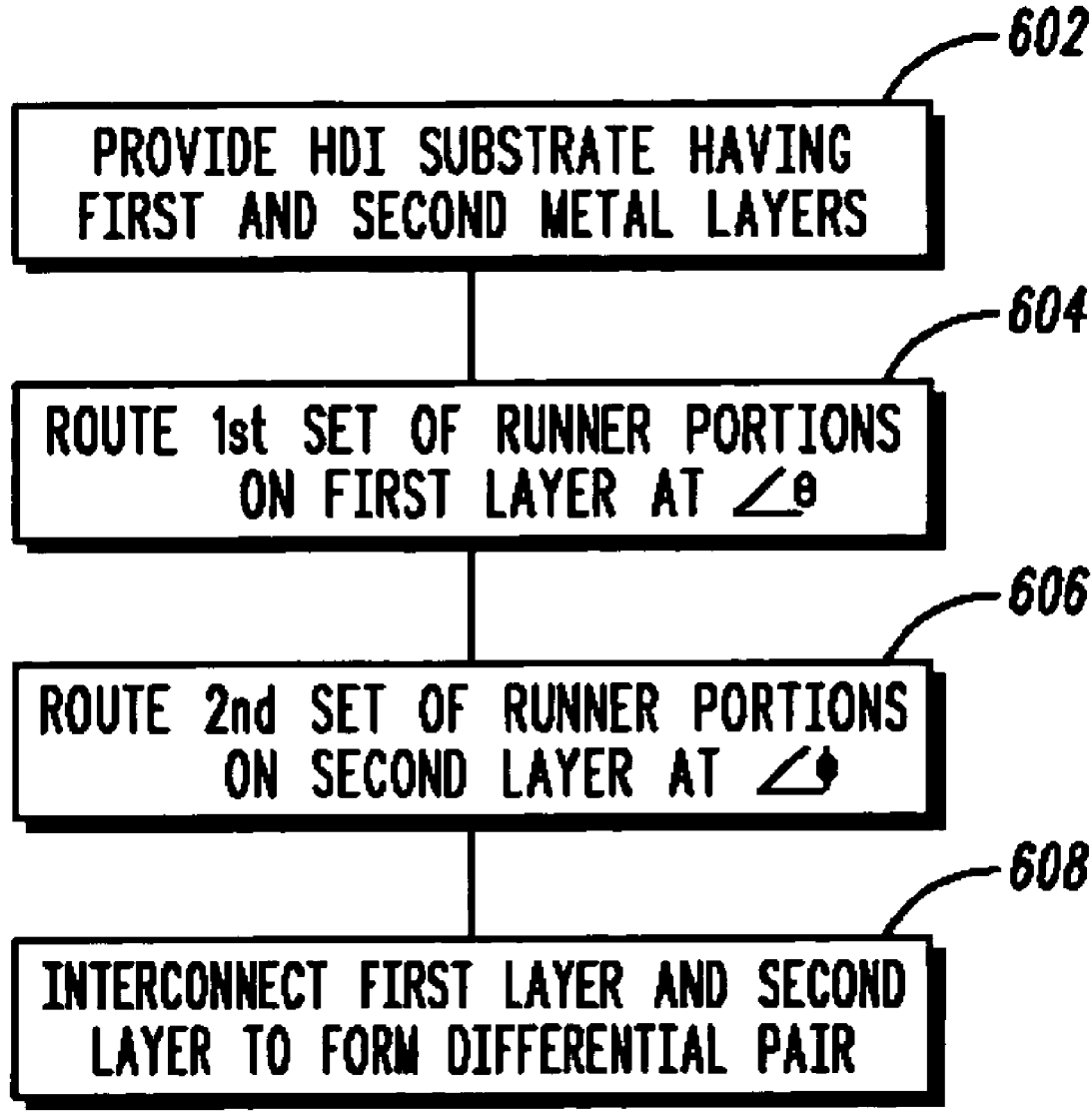
FIG. 6 illustrates a method for routing a printed circuit board to form a differential pair in accordance with the present invention.

Referring to FIG. 6, there is shown a method 600 for routing a printed circuit board to form a differential pair in accordance with the present invention. Method 600 begins by providing at least one HDI substrate having first and second metal layers at step 602. Combinations of HDI and traditional printed circuit board, such as FR4, can be used, for example 1:2:1 HDI or 2:4:2 HDI or alternatively, a board comprising all HDI can also be used. The differential pair is routed by routing a first set of runner portions on one metal layer of the HDI substrate at a first angle 604 and routing a second set of runner portions on the next metal layer of the HDI substrate at a second angle 606, the second angle being orthogonal to the first angle. In accordance with the present invention, step 608 interconnects the one metal layer to the next metal layer to form the differential pair from the first and second sets of runner portions.

The step of interconnecting the one metal layer to the next metal layer 608 is achieved by coupling every other runner of the first set of runner portions to every other runner of the second set of runner portions using microvias to form a first runner; and coupling the remaining runners of the first and second sets of runner portions to form a second runner, the first and second runners forming the differential pair. Depending on the circuit application, the first set of runner portions are routed at a predetermined distance and spacing from the second set of runner portions to provide a predetermined desired capacitance.

The differential pair formed in accordance with the present invention provides the advantage of taking up minimal space leaving room for other circuits to run on layers below. Since the differential pair of the present invention is less susceptible to noise, components from other circuits no longer have to be spaced as far away from the pair as was the case with the side by side parallel configuration of the prior art.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

We claim:

1. A printed circuit board, comprising:
    at least one high density interconnect (HDI) substrate having first and second metal layers;
    a first runner formed of:
    a first set of individual upper runner portions etched on the first metal layer at a first predetermined angle;
    a second set of individual lower runner portions etched on the second metal layer at an angle orthogonal to the first predetermined angle;
    a microvia coupling the first set of individual upper runner portions to the second set of individual lower runner portions;
    a second runner formed of:
    a third set of individual upper runner portions etched on the first metal layer at the first predetermined angle in between the first set of individual upper runner portions;
    a fourth set of individual lower runner portions etched on the second metal layer at the angle orthogonal to the first predetermined angle in between the second set of individual lower runner portions;
    a microvia coupling the third set of individual upper runner portions to the fourth set of individual lower runner portions; and
    the first and second runners providing a differential pair for transferring a differential signal.

2. A method of routing a printed circuit board, comprising:
    providing at least one high density interconnect (HDI) substrate having first and second metal layers;
    routing a first set of runner portions on the first metal layer at a first angle;
    routing a second set of runner portions on the second metal layer at a second angle, the second angle being orthogonal to the first angle; and
    interconnecting the first metal layer to the second metal layer to form a differential pair from the first and second sets of runner portions, wherein interconnecting the first metal layer to the second metal layer comprises,
        coupling every other runner of the first set of runner portions to every other runner of the second set of runner portions using microvias to form a first runner, and
        coupling the remaining runners of the first and second sets of runner portions to form a second runner, the first and second runners forming the differential pair.

3. The method of claim 2, wherein the steps of routing the first and second set of runner portions further includes the step of routing the first set of runner portions at a predetermined distance from the second set of runner portions to provide a predetermined capacitance.

* * * * *